(12) United States Patent
Guo

(10) Patent No.: US 9,647,008 B2
(45) Date of Patent: May 9, 2017

(54) METHOD OF FORMING CONTACT STRUCTURE IN ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jian Guo, Beijing (CN)

(73) Assignees: BOE TECHNOLOGY GROUP CO., LTD., Chaoyang District, Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/030,596

(22) PCT Filed: Dec. 28, 2015

(86) PCT No.: PCT/CN2015/099155
§ 371 (c)(1),
(2) Date: Apr. 20, 2016

(87) PCT Pub. No.: WO2017/000521
PCT Pub. Date: Jan. 5, 2017

(65) Prior Publication Data
US 2017/0005117 A1    Jan. 5, 2017

(30) Foreign Application Priority Data
Jun. 30, 2015 (CN) .......................... 2015 1 0372763

(51) Int. Cl.
*H01L 23/52* (2006.01)
*H01L 33/62* (2010.01)
(Continued)

(52) U.S. Cl.
CPC .... *H01L 27/1248* (2013.01); *G02F 1/136227* (2013.01); *H01L 27/1259* (2013.01)

(58) Field of Classification Search
CPC ....... H01L 2224/13016; H01L 27/1214; H01L 21/0214; H01L 21/563; H01L 27/1248; H01L 27/1259
See application file for complete search history.

(56) References Cited

U.S. PATENT DOCUMENTS 6,200,904 B1    3/2001  Tan et al.
6,686,120 B2 *  2/2004  Lee ......................... G03F 7/40
                                                            430/165

(Continued)

FOREIGN PATENT DOCUMENTS

CN    105097668 A    11/2015

OTHER PUBLICATIONS

International Search Report & Written Opinion mailed Mar. 8, 2016 regarding PCT/CN2015/099155.

*Primary Examiner* — Thomas L Dickey
*Assistant Examiner* — Damon Hillman
(74) *Attorney, Agent, or Firm* — Intellectual Valley Law, P.C.

(57) ABSTRACT

The present application discloses a method of fabricating an array substrate comprising forming a via extending through a first insulating layer and a second insulating layer, the via comprising a first sub-via in the first insulating layer and the second sub-via in a second insulating layer; mobilizing a portion of first insulating layer material surrounding the first sub-via; and distributing the mobilized portion of the first insulating layer material over a sidewall of the second sub-via.

13 Claims, 2 Drawing Sheets

(51) Int. Cl.
*H01L 27/12* (2006.01)
*G02F 1/1362* (2006.01)

(56) References Cited

U.S. PATENT DOCUMENTS

| | | | |
|---|---|---|---|
| 7,968,385 B2* | 6/2011 | Jeong | H01L 27/12 |
| | | | 438/154 |
| 8,193,031 B2* | 6/2012 | Hosoba | H01L 21/02554 |
| | | | 257/E21.09 |
| 2006/0138947 A1* | 6/2006 | MacPherson | H01L 27/3253 |
| | | | 313/506 |
| 2008/0061446 A1* | 3/2008 | You | H01L 21/76804 |
| | | | 257/774 |
| 2011/0229991 A1* | 9/2011 | Wang | H01L 21/561 |
| | | | 438/26 |
| 2014/0183536 A1 | 7/2014 | Park et al. | |
| 2015/0228798 A1 | 8/2015 | Lee et al. | |

* cited by examiner

FIG. 1

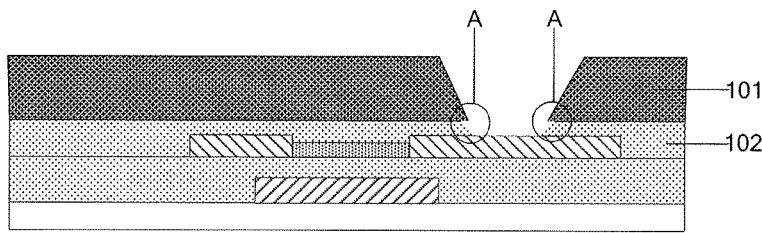

FIG. 2

| Forming a via extending through a first insulating layer and a second insulating layer, the via comprising a first sub-via in the first insulating layer and a second sub-via in the second insulating layer. |
|---|
| Mobilizing a portion of first insulating layer material surrounding the first sub-via. |
| Distributing the mobilized portion of the first insulating layer material over a sidewall of the second sub-via. |

METHOD OF FORMING CONTACT STRUCTURE IN ARRAY SUBSTRATE

CROSS-REFERENCE TO RELATED APPLICATION

This application is a national stage application under 35 U.S.C. 371 of International Application No. PCT/CN2015/099155 filed Dec. 28, 2015, which claims priority to Chinese Patent Application No. 201510372763.3, filed Jun. 30, 2015, the contents of which are incorporated by reference in the entirety.

FIELD

The present invention relates to display technology, more particularly, to an array substrate, a display device having the same, and a fabricating method thereof.

BACKGROUND

In an array substrate, a thin film transistor is formed on a base substrate. A passivation layer is deposited on the thin film transistor, and a resin layer is deposited on the passivation layer. For connecting a pixel electrode to a drain electrode in the thin film transistor, a via is formed in the resin layer and the passivation layer, extending through both layers to the surface of the drain electrode. A pixel electrode material is then deposited in the via.

SUMMARY

In one aspect, the present disclosure provides a method of fabricating an array substrate, comprising forming a via extending through a first insulating layer and a second insulating layer, the via comprising a first sub-via in the first insulating layer and the second sub-via in a second insulating layer; mobilizing a portion of first insulating layer material surrounding the first sub-via; and distributing the mobilized portion of the first insulating layer material over a sidewall of the second sub-via.

Optionally, the method further comprises forming a film of the mobilized portion of the first insulating layer material over the sidewall of the second sub-via.

Optionally, a surface of the film extends from over a sidewall of the first sub-via to over the sidewall of the second sub-via, the surface of the film within the first sub-via and the surface of the film within the second sub-via are substantially on a same plane.

Optionally, the step of forming the via comprises etching the first insulating layer to form the first sub-via; and etching the second insulating layer to form the second sub-via.

Optionally, the first insulating layer is made of a curable material, and the step of mobilizing and distributing are performed by curing the first insulating layer.

Optionally, the curing is performed at a curing temperature in a range of 245° C. to 255° C. and with a curing duration in a range of 20 minutes to 40 minutes.

Optionally, the curing temperature is around 250° C. and the curing duration is around 30 minutes.

Optionally, the method further comprises pre-curing the first insulating layer after the etching of the first insulating layer and prior to the etching of the second insulating layer.

Optionally, the pre-curing step is performed at a pre-curing temperature in a range of around 125° C. to around 135° C. and with a pre-curing duration in a range of around 150 seconds to around 250 seconds.

Optionally, the step of etching the first insulating layer is performed with an exposure dose less than 100 mj, a drying pressure less than 26 Pa, and a develop time longer than 70 seconds.

Optionally, the step of etching the second insulating layer is performed by plasma etching with a radio frequency power in a range of around 4000 mW to around 7000 mW.

Optionally, the step of etching the second insulating layer is performed by plasma etching using a plasma comprising sulfur hexafluoride and helium.

Optionally, the first insulating layer is resistant to the etching of the second insulating layer.

Optionally, the first insulating layer is made of a resin material, and the second insulating layer is made of a material comprising silicon nitride.

Optionally, the method further comprises forming a thin film transistor comprising a drain electrode on a base substrate; forming a second insulating layer on a side of the drain electrode distal to the base substrate; and forming a first insulating layer on a side of the second insulating layer distal to the base substrate.

Optionally, the via is at a position corresponding to a drain electrode of a thin film transistor.

In another aspect, the present disclosure provides an array substrate manufactured by a method described herein.

In another aspect, the present disclosure provides an array substrate comprising a second insulating layer of a second insulating layer material on a base substrate; a first insulating layer of a first insulating layer material different from the second insulating layer material on a side of the second insulating layer distal to the base substrate; a via extending through a first insulating layer and a second insulating layer, the via comprising a first sub-via in the first insulating layer and the second sub-via in a second insulating layer; and a film of the first insulating layer material over a sidewall of the second sub-via.

Optionally, the first insulating layer material is a resin material, and the second insulating layer material is silicon nitride.

Optionally, the array substrate further comprises a thin film transistor comprising a drain electrode on a side of the second insulating layer proximal to the base substrate; wherein the via is at a position corresponding to a drain electrode of a thin film transistor.

Optionally, a surface of the film extends from over a sidewall of the first sub-via to over the sidewall of the second sub-via, the surface of the film within the first sub-via and the surface of the film within the second sub-via are substantially on a same plane.

In another aspect, the present disclosure further provides a display panel comprising an array substrate described herein or manufactured by a method described herein.

BRIEF DESCRIPTION OF THE FIGURES

The following drawings are merely examples for illustrative purposes according to various disclosed embodiments and are not intended to limit the scope of the present invention.

FIG. 1 is a diagram illustrating the structure of a conventional array substrate.

FIG. 2 is a flow chart illustrating a method of fabricating an array substrate in some embodiments.

DETAILED DESCRIPTION

Figure 3:
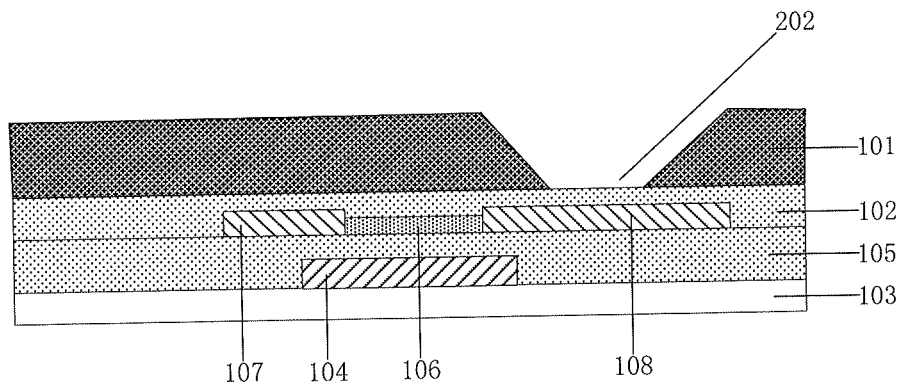
FIG. 3 is a diagram illustrating a process of forming a first sub-via in an array substrate in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

FIG. 1 is a diagram illustrating the structure of a conventional array substrate. As shown in FIG. 1, in making an array substrate of a liquid crystal display device, typically a passivation layer 102 is formed underneath a resin layer 101. The passivation layer 102 enhances performance of a thin film transistor by preventing the thin film transistor from corrosion caused by external water vapor. In the process of making the array substrate, the resin layer 101 is subject to UV exposure, development, and curing. The passivation layer 102 is then etched to form a via. Because the resin layer 101 is resistant to the etching process performed on the passivation layer 102, the passivation layer 102 is not only etched in an exposed area, but is further etched into an area underneath the resin layer 101, forming a barbed structure (area "A" in FIG. 1). This results in a fractured pixel electrode layer structure in a subsequent step of depositing pixel electrode material in the via, leading to poor contact.

FIG. 2 is a flow chart illustrating a method of fabricating an array substrate in some embodiments. Referring to FIG. 2, the method in the embodiment includes forming a via extending through a first insulating layer and a second insulating layer, the via comprising a first sub-via in the first insulating layer and a second sub-via in the second insulating layer; mobilizing a portion of first insulating layer material surrounding the first sub-via; and distributing the mobilized portion of the first insulating layer material over a sidewall of the second sub-via. Due to the distribution of mobilized portion of the first insulating layer material over the sidewall of the second sub-via, the barbed structure described above can be filled with the mobilized portion of the first insulating layer material. As a result, any obvious surface irregularity can be eliminated or significantly reduced. For example, the resulting inner surface of the via smoothly transitions through the interface between the first insulating layer and the second insulating layer, e.g., the inner surface of the first sub-via and the inner surface of the second sub-via are substantially on a same plane. The array substrate accordingly to the present method has superior properties. The fractured pixel electrode layer and poor contact in the conventional array substrate can be avoided.

In some embodiments, the method further includes forming a film of the mobilized portion of the first insulating layer material over the sidewall of the second sub-via. The surface of the film extends from over a sidewall of the first sub-via to over the sidewall of the second sub-via. For example, the surface of the film within the first sub-via and the surface of the film within the second sub-via are substantially on a same plane.

In some embodiments, the step of forming the via includes etching the first insulating layer to form the first sub-via; and etching the second insulating layer to form the second sub-via. The first insulating layer and the second insulating layer may be made of different materials and etched using different methods. Because they are made of different materials, the etch condition used for etching the first insulating layer may not etch the second insulating layer. Conversely, the etch condition used for etching the second insulating layer may not etch the first insulating layer, i.e., the first insulating layer is resistant to the etching of the second insulating layer.

Various embodiments of the present method can be practiced for fabricating various vias corresponding to various positions in an array substrate. The first and second insulating layers can be any insulating layers in an array substrate. In some embodiments, the first insulating layer is a resin layer. In some embodiments, the second insulating layer is a passivation layer. Optionally, the first insulating layer is an insulating layer made of a curable material such as a resin material. Optionally, the second insulating layer is an insulating layer made of an inorganic insulating material such as silicon nitride or silicon oxide.

In some embodiments, the via is at a position corresponding to a drain electrode of a thin film transistor. Optionally, the method further includes forming a thin film transistor comprising a drain electrode on a base substrate; forming a second insulating layer on a side of the drain electrode distal to the base substrate; and forming a first insulating layer on a side of the second insulating layer distal to the base substrate.

FIG. 3 is a diagram illustrating a process of forming a first sub-via in an array substrate in some embodiments. Referring to FIG. 3, the array substrate in the embodiment includes a thin film transistor having a gate electrode, an active layer, a source electrode and a drain electrode. Specifically, the array substrate in the embodiment includes a base substrate 103, a gate electrode 104 on the base substrate 103, a gate insulating layer 105 on a side of the gate electrode 104 distal to the base substrate 103, an active layer 106 on a side of the gate insulating layer 105 distal to the base substrate 103, and a source electrode 107 and a drain electrode 108 on a side of the active layer 106 distal to the base substrate 103.

The array substrate in the embodiment further includes a resin layer 101 (e.g., the first insulating layer) and a passivation layer 102 (e.g., the second insulating layer). The passivation layer 102 is on a side of the source electrode 107 and the drain electrode 108 distal to the base substrate 103. The resin layer 101 is on a side of the passivation layer 102 distal to the base substrate 103. Optionally, the resin layer is made of a resin material. Optionally, the passivation layer is made of a silicon nitride material.

As shown in FIG. 3, the method in the embodiment includes forming a via extending through the resin layer 101 and the passivation layer 102. The via includes two parts, a first sub-via 202 in the resin layer 101 and a second sub-via in the passivation layer 102. The inner surface of the via smoothly transitions through the interface between the resin layer 101 and the passivation layer 102, e.g., the inner surface of the first sub-via 202 in the resin layer 101 and the inner surface of the second sub-via in the passivation layer 102 are substantially on a same plane. Such a via structure avoids any obvious surface irregularity (e.g., a barbed via structure in conventional array substrate). The fractured pixel electrode layer and poor contact in the conventional array substrate can be eliminated.

In some embodiments, the step of forming the via includes etching the first insulating layer to form the first sub-via 202. Optionally, the first sub-via 202 is at a position corresponding to a drain electrode 108 of a thin film transistor.

In some embodiments, the method further includes coating a photoresist layer on the resin layer 101, exposing the photoresist layer with a mask, developing the exposed photoresist layer to obtain a photoresist pattern having a first section corresponding to the first sub-via 202 and a second section which is outside the first section, the photoresist layer in the first section is removed. The method further includes etching the resin layer 101 and forming a first sub-via 202 at a position corresponding to a drain electrode 108 of a thin film transistor.

In some embodiments, the exposing step is a controlled exposing step. The etching is performed optionally with an exposure dose less than 100 mj, optionally with a drying pressure is less than 26 Pa, and/or optionally with a develop time longer than 70 seconds. A controlled exposing step avoids formation of a first sub-via 202 having a large slope, which leads to limited resin material mobility in a following mobilizing step. That is, the resin material on the surface of a first sub-via 202 having a large slope may not be easily mobilized. Consequently, it would be more difficult to distribute resin material over the sidewall of the second sub-via formed in subsequent steps.

In some embodiments, the method further includes a pre-curing step after the etching of the first insulating layer and prior to the etching of the second insulating layer. Optionally, the pre-curing step is performed at a pre-curing temperature around 130° C. (e.g., 125° C. to 135° C.) and with a pre-curing duration around 200 seconds (e.g., 150 seconds to 250 seconds). A pre-cured resin layer 101 is more stable and more resistant to the dry etching used for subsequent etching of the passivation layer 102.

In some embodiments, the step of forming the via further includes etching the second insulating layer to form the second sub-via. Optionally, the second sub-via is at a position corresponding to a drain electrode 108 of a thin film transistor.

Figure 4:
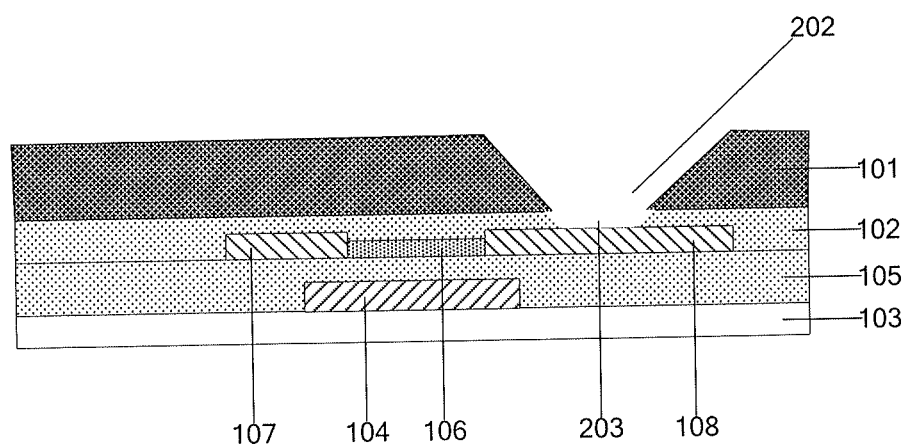
FIG. 4 is a diagram illustrating a process of forming a second sub-via in an array substrate in some embodiments.

FIG. 4 is a diagram illustrating a process of forming a second sub-via 203 in an array substrate in some embodiments. Referring to FIG. 4, the method in the embodiment includes coating a photoresist layer on the resin layer 101, exposing the photoresist layer with a mask, developing the exposed photoresist layer to obtain a photoresist pattern having a first section corresponding to the second via 203 and a second section which is outside the first section, the photoresist layer in the first section is removed. The method further includes etching the passivation layer 102 and forming a second sub-via 203 at a position corresponding to a drain electrode 108 of a thin film transistor.

Optionally, the etching of the second insulating layer is performed by dry etching. Because the resin layer 101 is resistant to the dry etching condition, the passivation layer 102 may be etched laterally underneath the resin layer 101, forming a barbed structure (as shown in a conventional array substrate of FIG. 1).

Optionally, the etching of the second insulating layer is a controlled etching step to reduce lateral etching of the passivation layer 102. Optionally, the step of etching the second insulating layer is performed by plasma etching using a plasma containing sulfur hexafluoride and helium. Optionally, the plasma is free of chlorine. Optionally, the step of etching the second insulating layer is performed by plasma etching with a radio frequency power in a range of around 4000 mW to around 7000 mW (e.g., around 4000 mW to around 5000 mW, around 5000 mW to around 6000 mW, or around 6000 mW to around 7000 mW), minimizing damage to the surface of the resin layer 101.

Figure 5:
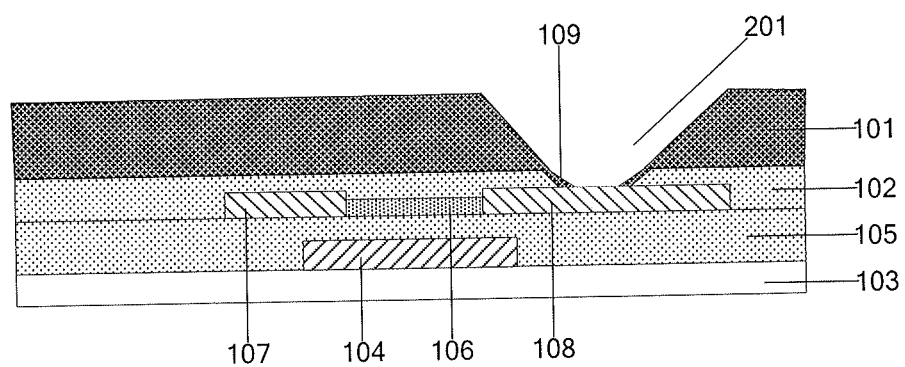
FIG. 5 is a diagram illustrating a process of forming a via in an array substrate in some embodiments.

In some embodiments, the method includes forming a film of a mobilized portion of the first insulating layer material over the sidewall of the second sub-via 203. FIG. 5 is a diagram illustrating a process of forming a via in an array substrate in some embodiments. Referring to FIG. 5, the resin layer 101 has been pre-cured as described above, but is not completely solidified. A portion of the resin material can become mobilized during a curing process as described herein. The step of mobilizing and distributing the resin layer 101 in the embodiment is performed by curing the resin layer 101. For example, the curing can be performed at a curing temperature in a range of 245° C. to 255° C., e.g., around 250° C. Optionally, the curing is performed with a curing duration in a range of 20 minutes to 40 minutes, e.g., around 30 minutes. Optionally, the curing is performed at a temperature around 250° C. and with a curing duration of around 30 minutes.

By mobilizing a portion of the resin layer 101 surrounding the first sub-via, a portion of the resin material can be distributed over the sidewall of the second sub-via. Further, a resin film 109 can be formed over the sidewall of the second sub-via (FIG. 5). The surface of the resin film 109 extends from over a sidewall of the first sub-via to over the sidewall of the second sub-via. The resin film 109 covers surface irregularities on the inner surface of the via 201, e.g., the barbed via structure and/or the irregularities resulting from the etching steps. The surface of the resin film 109 with the first sub-via and the surface of the resin film 109 within the second sub-via are substantially on a same plane.

Based on the above, the method in the embodiment includes forming a via extending through the resin layer 101 and the passivation layer 102. The inner surface of the via smoothly transitions through the interface between the resin layer 101 and the passivation layer 102, e.g., the inner surface of the first sub-via 202 in the resin layer 101 and the inner surface of the second sub-via in the passivation layer 102 are substantially on a same plane. Such a via structure avoids any obvious surface irregularity (e.g., a barbed via structure in conventional array substrate). The fractured pixel electrode layer and poor contact in the conventional array substrate can be eliminated.

Accordingly, in some embodiments, the present disclosure also provides an array substrate having a second insulating layer of a second insulating layer material on a base substrate; a first insulating layer of a first insulating layer material different from the second insulating layer material on a side of the second insulating layer distal to the base substrate; a via comprising a first sub-via in a first insulating layer and a second sub-via in a second insulating layer; the via extending through the first insulating layer and the second insulating layer; and a film of the first insulating layer material over a sidewall of the second sub-via. Optionally, the array substrate further includes a thin film transistor having a drain electrode on a side of the second insulating layer proximal to the base substrate. Optionally, the via is at a position corresponding to a drain electrode of a thin film transistor. Optionally, the first insulating layer material is a resin material, and the second insulating layer material is silicon nitride. Optionally, the first insulating layer is a resin layer. Optionally, the second insulating layer is a passivation layer.

The inner surface of the via smoothly transitions through the interface between the first insulating layer and the second insulating layer, e.g., the inner surface of the first sub-via in the first insulating layer and the inner surface of the second sub-via in the second insulating layer are substantially on a same plane. Such a via structure avoids any obvious surface irregularity (e.g., a barbed via structure in conventional array substrate). The fractured pixel electrode layer and poor contact in the conventional array substrate can be eliminated.

Referring to FIG. 5, the array substrate in the embodiment includes a gate electrode 104 on the base substrate 103, a gate insulating layer 105 on a side of the gate electrode 104 distal to the base substrate 103, an active layer 106 on a side of the gate insulating layer 105 distal to the base substrate 103, and a source electrode 107 and a drain electrode 108 on a side of the active layer 106 distal to the base substrate 103. The array substrate in the embodiment further includes a resin layer 101 (e.g., the first insulating layer) and a passivation layer 102 (e.g., the second insulating layer). The passivation layer 102 is on a side of the source electrode 107 and the drain electrode 108 distal to the base substrate 103. The resin layer 101 is on a side of the passivation layer 102 distal to the base substrate 103. Optionally, the resin layer is made of a resin material. Optionally, the passivation layer is made of a silicon nitride material.

The array substrate in the embodiment also includes a via 201 extending through the resin layer 101 and the passivation layer 102. The via 201 is at a position corresponding to the drain electrode 108 of the thin film transistor. The array substrate in the embodiment further includes a resin film 109 over the sidewall of the second sub-via. The surface of the resin film 109 extends from over a sidewall of the first sub-via to over the sidewall of the second sub-via. The resin film 109 covers surface irregularities on the inner surface of the via 201, e.g., the barbed via structure and/or the irregularities resulting from the etching steps. The surface of the resin film 109 with the first sub-via and the surface of the resin film 109 within the second sub-via are substantially on a same plane. Such a via structure avoids any obvious surface irregularity (e.g., a barbed via structure in conventional array substrate). The fractured pixel electrode layer and poor contact in the conventional array substrate can be eliminated.

The present disclosure further provides a display device having an array substrate described herein or an array substrate fabricated by a method described herein.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating an array substrate, comprising:
forming a via extending through a first insulating layer of a first insulating material and a second insulating layer of a second insulating material, the via comprising a first sub-via in the first insulating layer and a second sub-via in the second insulating layer, the first insulating material being different from the second insulating material;
mobilizing a portion of the first insulating material surrounding the first sub-via; and
distributing a mobilized first insulating material over a sidewall of the second sub-via;
wherein the step of forming the via comprises etching the first insulating layer to form the first sub-via; and etching the second insulating layer to form the second sub-via;
the method further comprises pre-curing the first insulating layer after the etching of the first insulating layer and prior to the etching of the second insulating layer.

2. The method of claim 1, further comprising forming a film of the mobilized portion of the first insulating layer material over the sidewall of the second sub-via.

3. The method of claim 2, wherein a surface of the film extends from over a sidewall of the first sub-via to over the sidewall of the second sub-via, the surface of the film within the first sub-via and the surface of the film within the second sub-via are substantially on a same plane.

4. The method of claim 1, wherein the first insulating layer is made of a curable material, and the step of mobilizing and distributing are performed by curing the first insulating layer.

5. The method of claim 4, wherein the curing is performed at a curing temperature in a range of 245° C. to 255° C. and with a curing duration in a range of 20 minutes to 40 minutes.

6. The method of claim 5, wherein the curing temperature is around 250° C. and the curing duration is around 30 minutes.

7. The method of claim 1, wherein the pre-curing step is performed at a pre-curing temperature in a range of around 125° C. to around 135° C. and with a pre-curing duration in a range of around 150 seconds to around 250 seconds.

8. The method of claim 1, wherein the step of etching the first insulating layer is performed with an exposure dose less than 100 mj, a drying pressure less than 26 Pa, and a develop time longer than 70 seconds.

9. The method of claim 1, wherein the step of etching the second insulating layer is performed by plasma etching with a radio frequency power in a range of around 4000 mW to around 7000 mW.

10. The method of claim 1, wherein the step of etching the second insulating layer is performed by plasma etching using a plasma comprising sulfur hexafluoride and helium.

11. The method of claim 1, wherein the first insulating layer is resistant to the etching of the second insulating layer.

12. The method of claim 1, wherein the first insulating layer is made of a resin material, and the second insulating layer is made of a material comprising silicon nitride.

13. The method of claim 1, further comprising:
forming a thin film transistor comprising a drain electrode on a base substrate;
forming a second insulating layer on a side of the drain electrode distal to the base substrate; and
forming a first insulating layer on a side of the second insulating layer distal to the base substrate;
wherein the via is at a position corresponding to a drain electrode of a thin film transistor.

* * * * *